United States Patent [19]

Sinclair

[11] Patent Number: 5,031,139
[45] Date of Patent: Jul. 9, 1991

[54] RANDOM ADDRESS SYSTEM FOR CIRCUIT MODULES

[75] Inventor: Alan W. Sinclair, Cambridge, United Kingdom

[73] Assignee: Anamartic Limited, Cambridge, England

[21] Appl. No.: 504,686

[22] Filed: Apr. 4, 1990

Related U.S. Application Data

[63] Continuation of Ser. No. 126,101, filed as PCT/GB87/00190 on Mar. 18, 1987 published as WO87/05724 on Sep. 24, 1987, abandoned.

[30] Foreign Application Priority Data

Mar. 18, 1986 [GB] United Kingdom ................. 8606695

[51] Int. Cl.$^5$ ............................................. G06F 13/00
[52] U.S. Cl. ...................................... 364/900; 370/16; 370/60
[58] Field of Search .................. 371/11.1, 11.2, 11.3; 370/60; 340/825.02, 825.83; 364/200 MS File, 900 MS File

[56] References Cited

U.S. PATENT DOCUMENTS

| | | | |
|---|---|---|---|
| 3,193,072 | 10/1975 | Catt | 340/172.5 |
| 4,020,469 | 4/1977 | Manning | 340/172.5 |
| 4,271,511 | 6/1981 | Manber et al. | 371/8 |
| 4,443,866 | 4/1984 | Burgiss, Sr. | 364/900 |
| 4,625,306 | 11/1986 | Newman | 370/60 |
| 4,794,594 | 12/1988 | Picard | 370/94 |
| 4,847,615 | 7/1989 | McDonald | 340/825.02 |

FOREIGN PATENT DOCUMENTS 0146275 11/1984 European Pat. Off. .

OTHER PUBLICATIONS

Manning, F. B., "An Approach to Highly Integrated, Computer-Maintained Cellular Arrays", *IEEE Transactions on Computers*, vol. C-26, No. 6, Jun. 1977, pp. 536-552.

Fussell, Donald and Peter Varman, "Fault-Tolerant Wafer-Scale Architectures for VLSI", *The 9th Annual Symposium on Computer Architecture*, Conference Proceedings, IEEE Computer Society and the Association for Computing Machinery, Apr. 26-29, 1982, Austin, Tex., pp. 190-198.

*Primary Examiner*—Dale M. Shaw
*Assistant Examiner*—Michael A. Jaffe
*Attorney, Agent, or Firm*—Robert F. O'Connell

[57] ABSTRACT

The wafer scale integrated circuit comprises an array of undiced chips or modules, each of which includes a data storing or processing circuit, e.g. a dynamic RAM, and configuration logic. Channels for data and control signals exist between each module and its (N, S, E and W) neighbors and a target module in the array may be addressed by setting up a path through the array from an entry module to the target module. The addressing is effected by sending a stream of link commands, each of which tells a module to link on to its (N, S, E or W) neighbor. Each module responds to the first command of the stream and then sends on the stream stripped of this first command. In an alternative embodiment the link commands are transmitted from module to module in parallel, each module responds to the command at the least significant end and strips it off by a shift of the commands in the least significant direction before the commands pass to the next module. A control circuit for addressing modules in the array at random forms a unique set of link commands for each module to be addressed, these command sets being such that the paths to the various modules form a densely branching tree commencing from the entry module.

23 Claims, 13 Drawing Sheets

RANDOM ADDRESS SYSTEM FOR CIRCUIT MODULES

This is a continuation of copending application Ser. No. 07/126,101 filed as PCT GB87/00190 on Mar. 18, 1987, published as WO87/05724 on Sep. 24, 1987, now abandoned.

The present invention relates to a random address system for an array of circuit modules which include configuration logic enabling the modules to be connected in a chain leading from a start or entry module to a target module. The modules may be part of a wafer scale integrated (WSI) circuit, or as sub-wafer-scale integrated circuit. As well as its configuration logic, each module includes a function unit which performs the function proper of the module.

GB 1 377 859 describes how circuit modules may be undiced chip areas of an integrated circuit wafer and a chain of modules may be grown by actuation of electronic switching functions within the modules. It is also proposed in GB 2 114 782 to store the sequence of commands necessary to set up a chain of good modules, preferably permanently in a PROM, and to set up the chain rapidly in accordance with the stored commands, whenever the device is switched on. A simple form of control logic using only a single global command line is described in our International patent application published as WO87/00675.

In all these prior devices, it is necessary to send repeated commands down the growing chain; each command tells the module currently at the end of the chain how to behave. The growth progress is therefore relatively slow, which is not a serious disadvantage if the growth process only takes place at switch-on.

The present invention relates to a technique for forming a chain of modules whenever a module is accessed. This has been proposed in our pending International Patent Application PCT/GB86/00601, unpublished at the date of filing the present application, using an extension of the technique in WO87/00675 and requiring a global command line. Rapid operation requires a significantly more efficient addressing. The object of this invention is to meet this need and the invention is defined in the appended claims.

It is convenient to say that the target module is target-addressed, whereas the preceding modules in the chain are link-addressed. In brief, the invention contemplates sending the address commands for all modules required to form a chain as a single address string, comprising a packet or group of bits for each addressed module. Each link-addressed module responds to its own group of bits to link on to the next module and sends on the string with that group stripped off.

It is possible to operate in bit-serial mode, in which case the address string gets shorter and shorter as each link-addressed module strips off the leading group of bits. It is also possible to operate in bit-parallel mode with a shift at each link-addressed module so as to shift out the just-used group of bits and bring the next group to the position at which it will be interpreted by the next module, which will be called the most significant position. The same channel as is utilized for data to pass to the function unit of a target-addressed module may be utilized to carry the address string. It is then necessary to provide some means of informing the target-addressed module that it is the target module, i.e. a means of escaping from the procedure of setting up the configuration logic in successive modules. This information could be included in each group of bits but this is a very wasteful solution. If each module has four neighbours to which it can connect, two bits suffice to identify which module to link to, i.e. each group of bits can be a di-bit. To add information to identify the target-addressed module would require a third bit, a 50% overhead.

A preferred solution in the case of bit-serial operation is for a module to regard itself as target-addressed when the group of bits which it receives tells it to link on to what is the preceding module already in the chain. In the case of bit-parallel operation, the end of the string may be marked by a single bit or other specific pattern no larger than one of the groups of bits. A module regards itself as target-addressed when the string which it receives has the specific pattern at the most significant position and is otherwise null.

It is preferred to relay a chip-select signal from addressed module to addressed module. The chain stays set up so long as chip-select remains asserted but clears down as soon as chip-select is de-asserted at the start module. The target module may relay a chip-select signal to its function unit.

It is possible to provide for certain instructions to be accepted by all addressed modules, i.e., link-addressed as well as target-addressed modules, whereby instructions can be broadcast to all modules in the chain. This is particularly advantageous if the function units are dynamic RAM and broadcast instructions can be used for efficient memory refresh.

The embodiments of the invention to be described below provide the following advantages:
Fast random chip access time
Fast change of addressed chip
No global timing information
High frequency data communications
Low distortion in routed clock signal
Efficient mapping of available chips on wafer
Data transmission security can be based on handshaking
Low susceptibility to interruption of path by noise
Simultaneous multiple chip access from multiple start chips
Easy synchronisation of data from multiple chips
Partial instruction broadcast
Control intelligence sited off wafer The invention will be described in more detail, by way of example, with reference to the accompanying drawings, in which:

Figure 6:
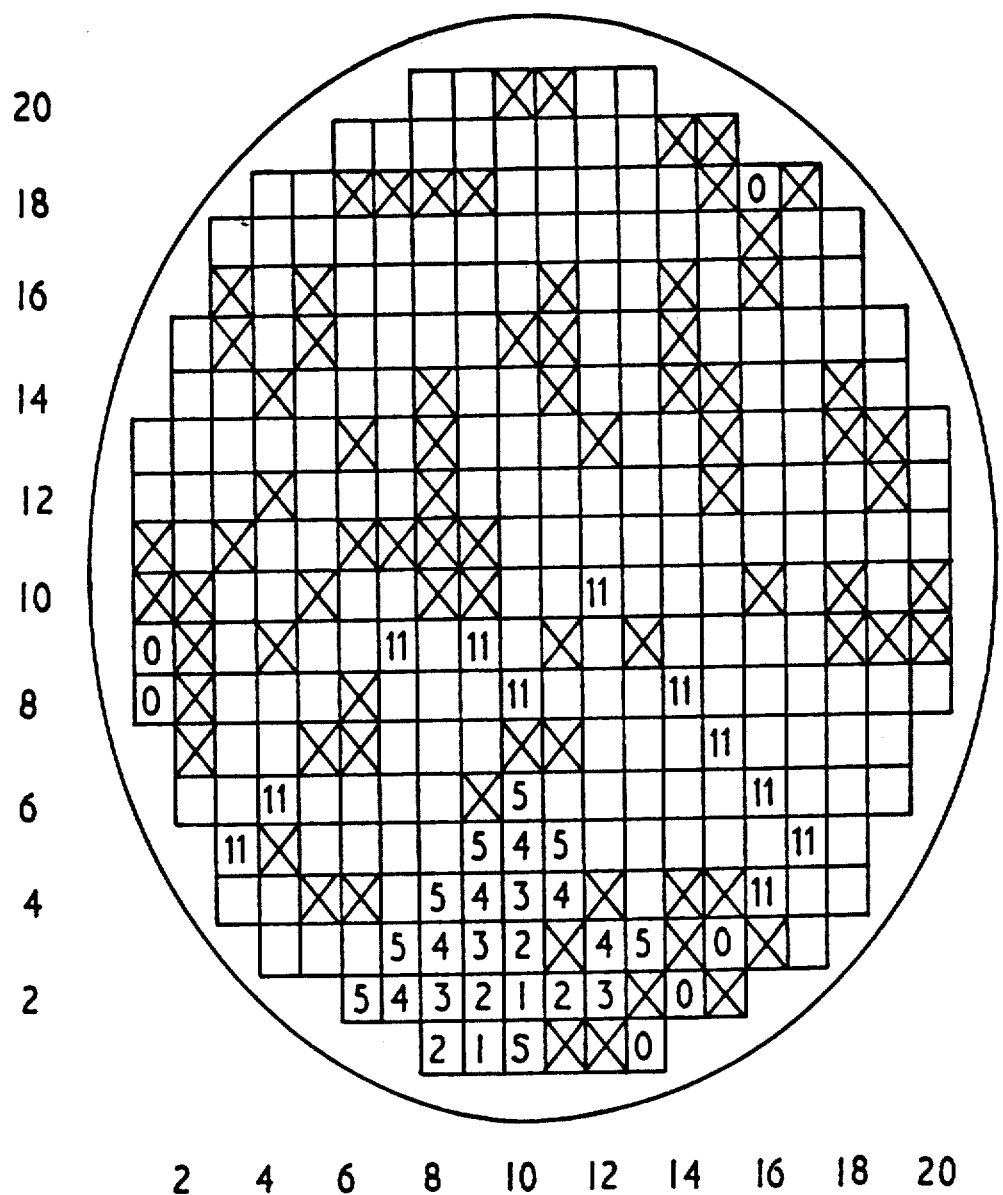
Figure 7:
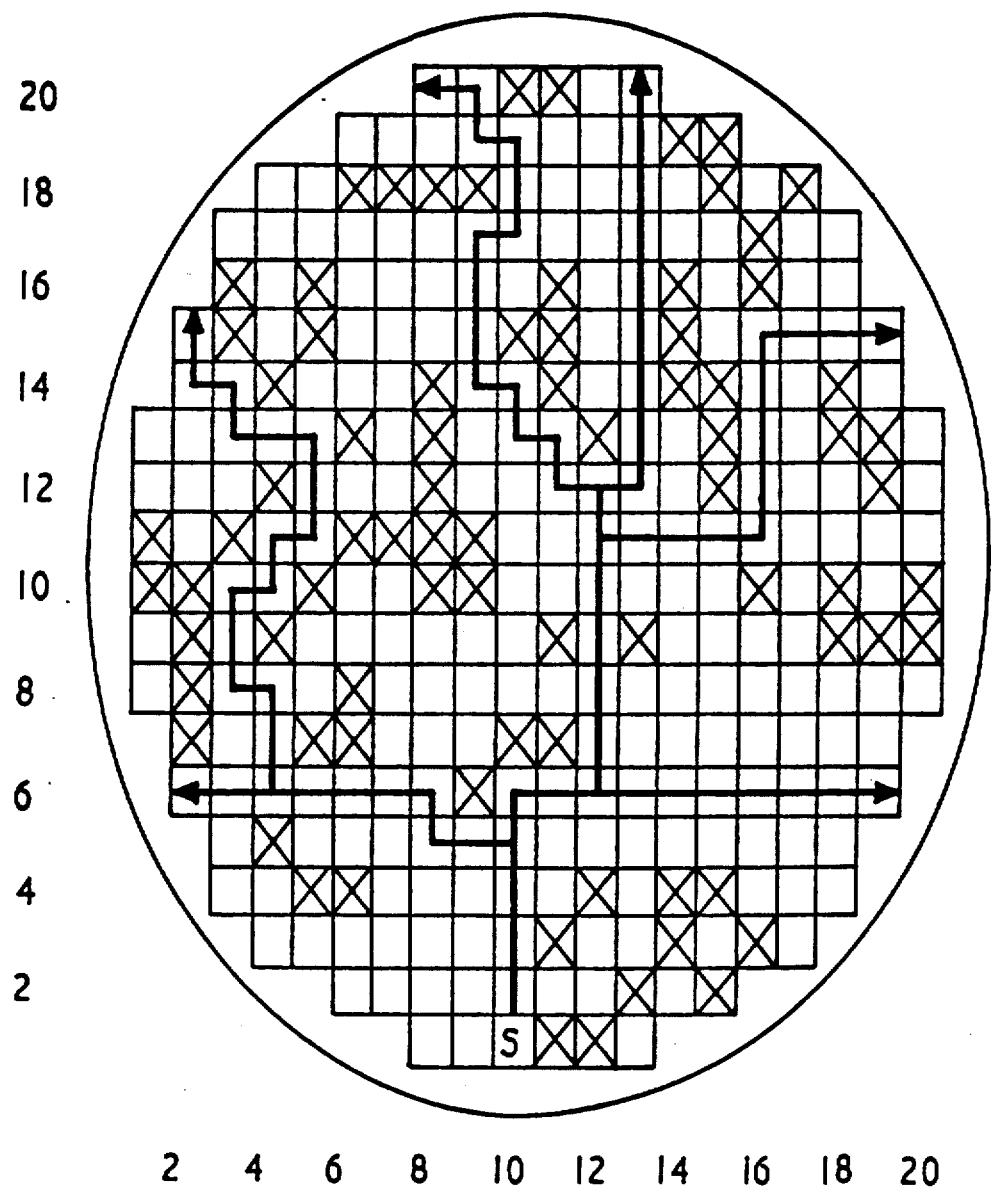
Figure 8:
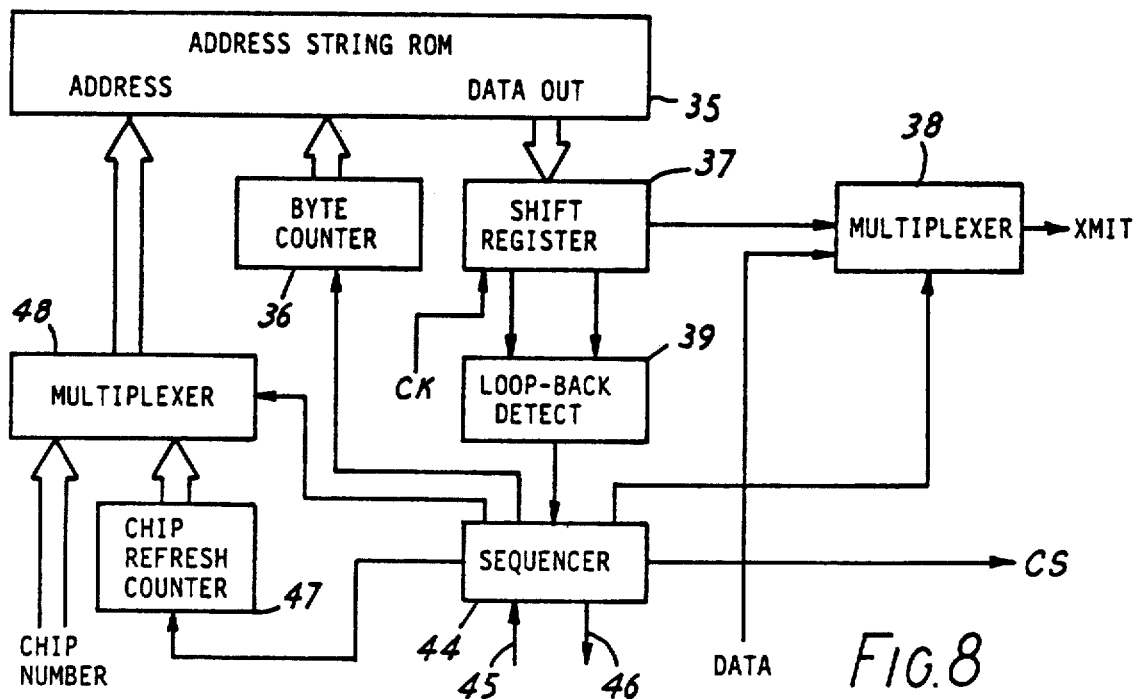
Figure 9:
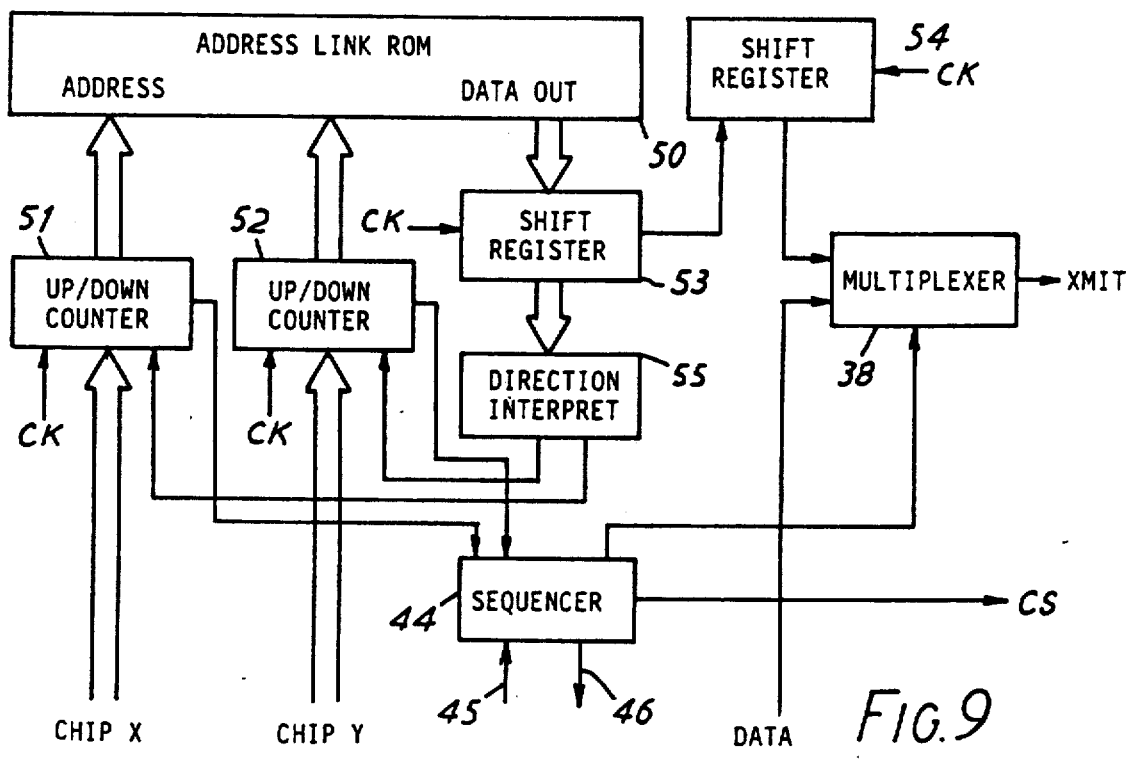
Figure 8A:
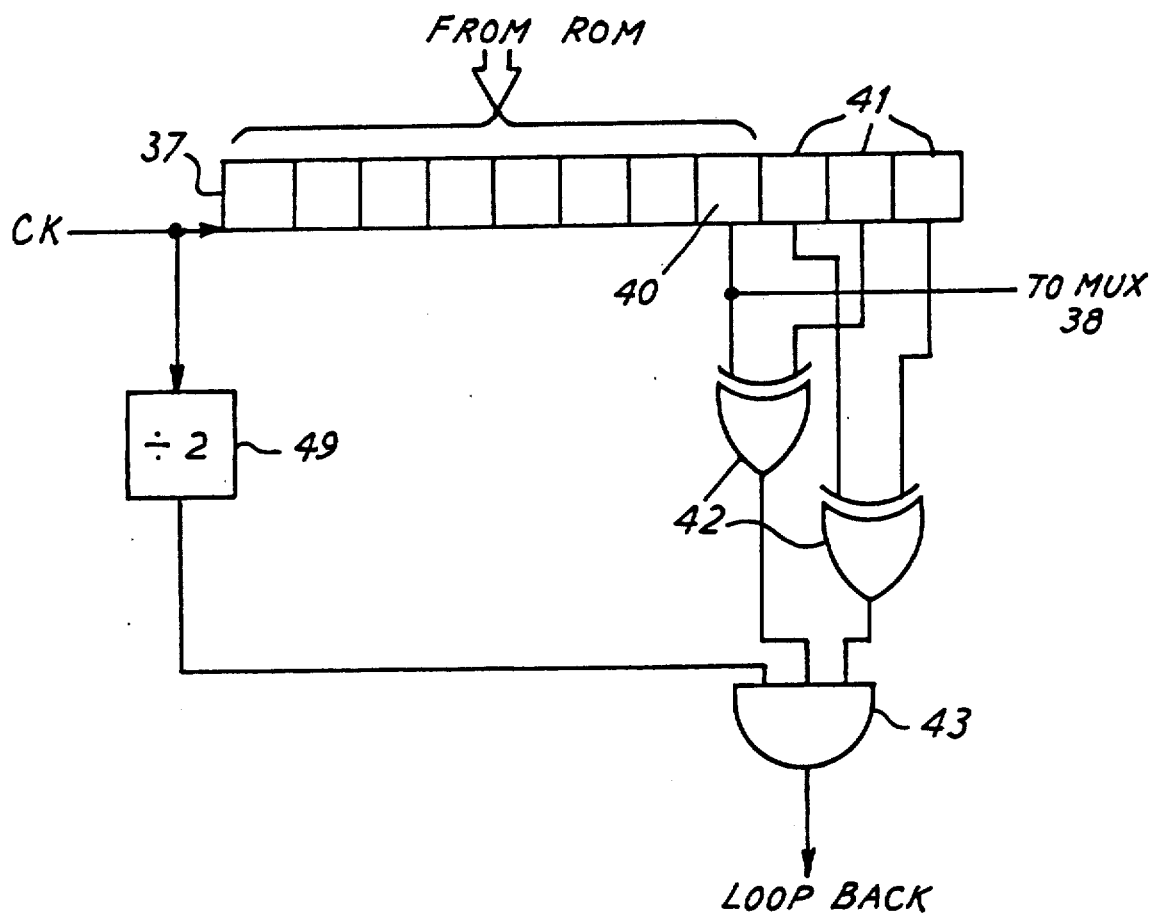
Figure 10:
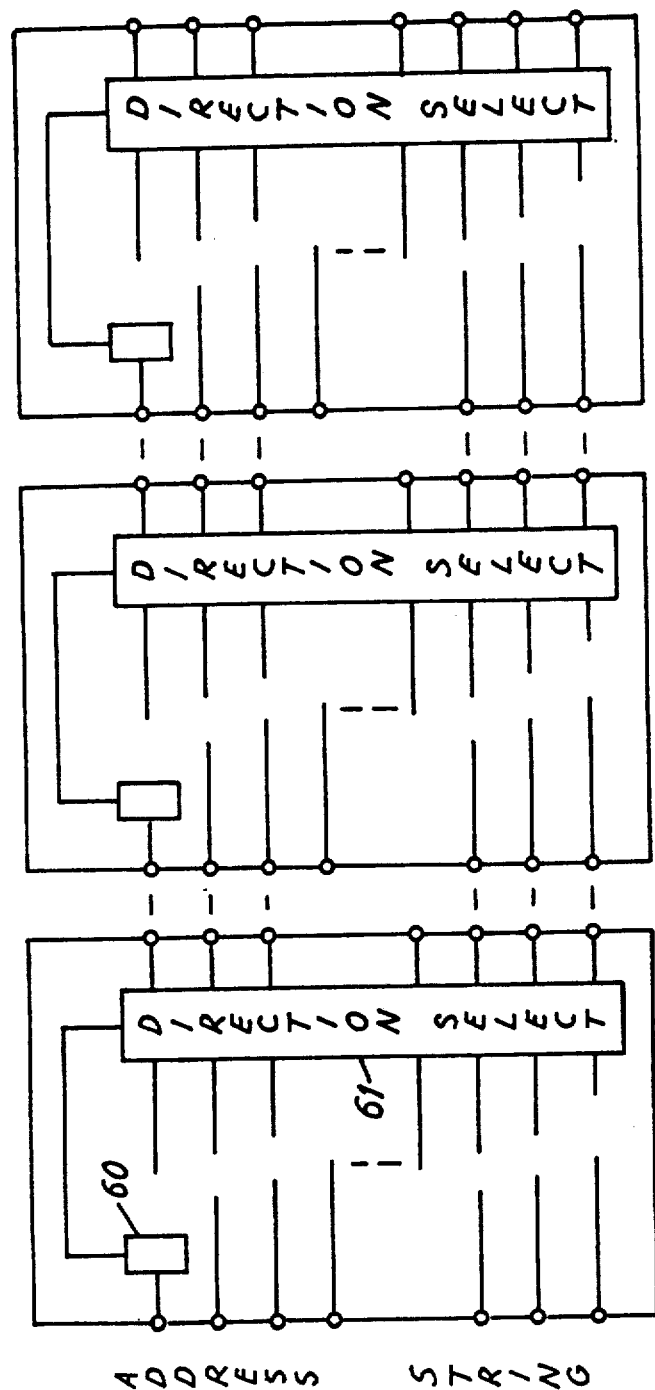
Figure 11A:
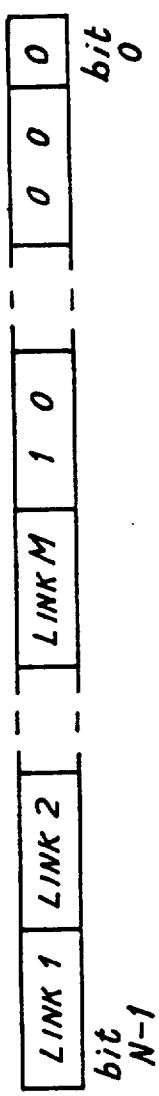
Figure 11B:
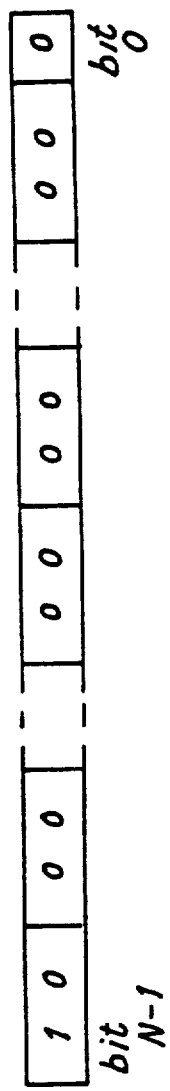
Figure 12:
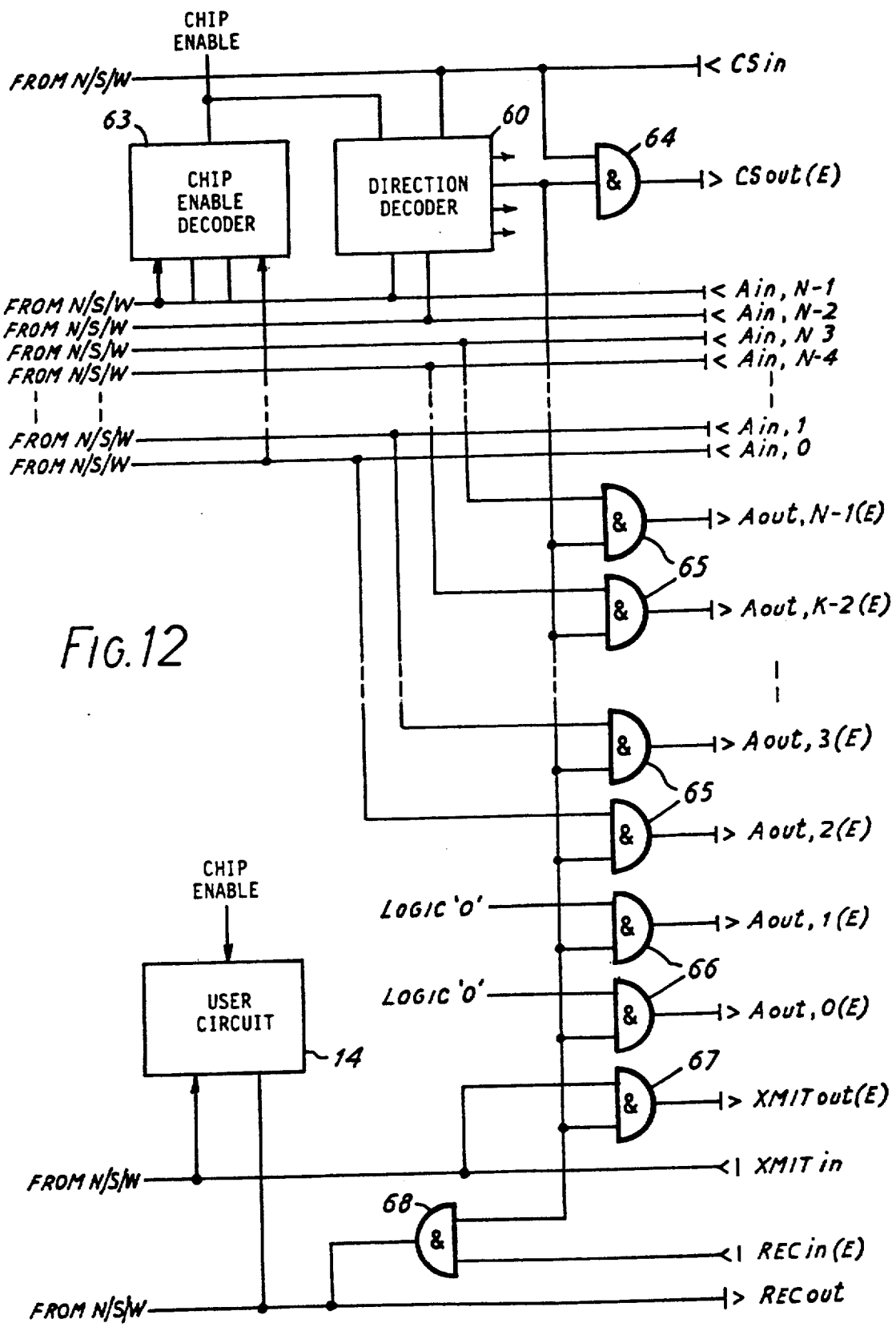
Figure 13:
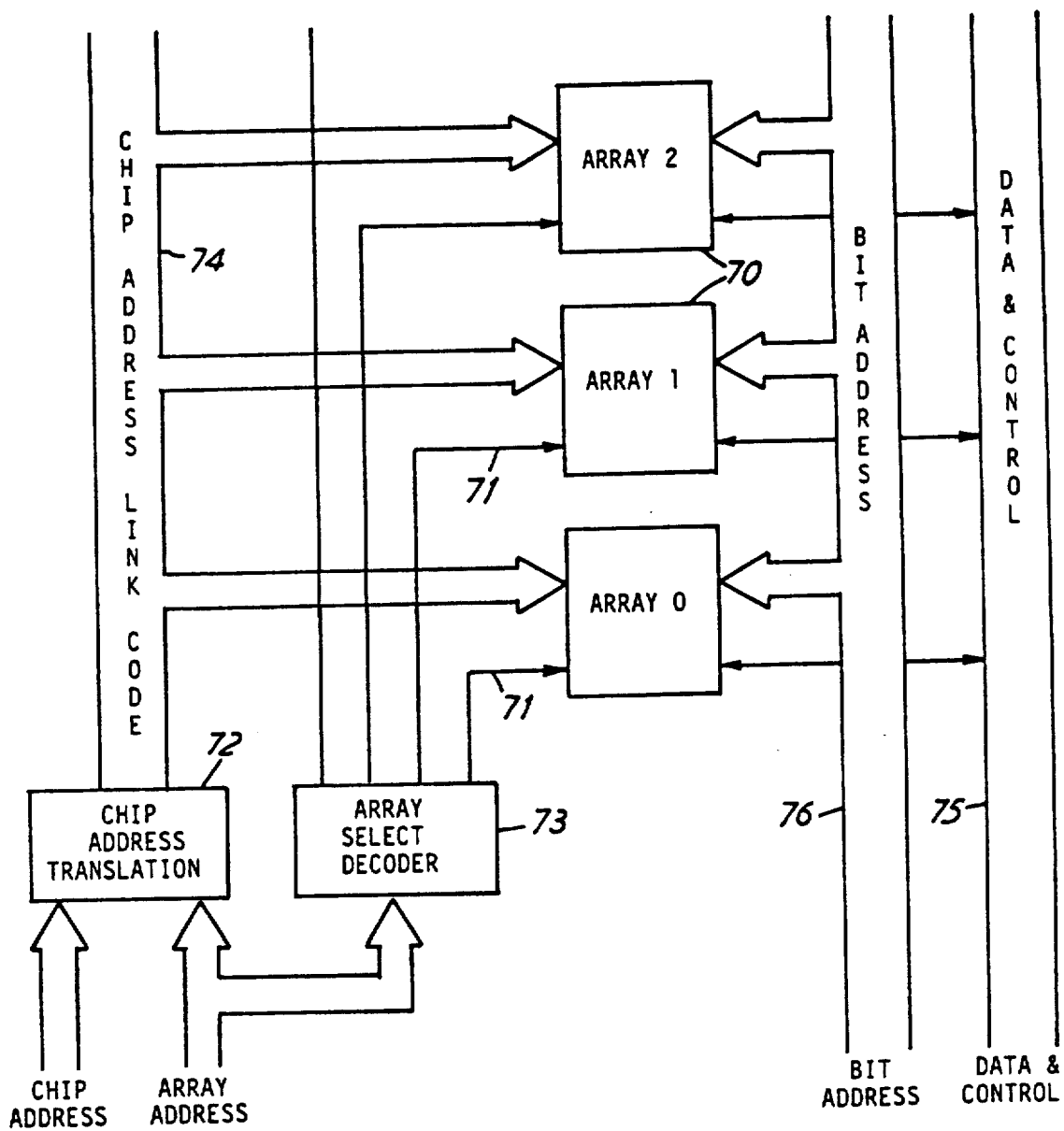
Figure 14:
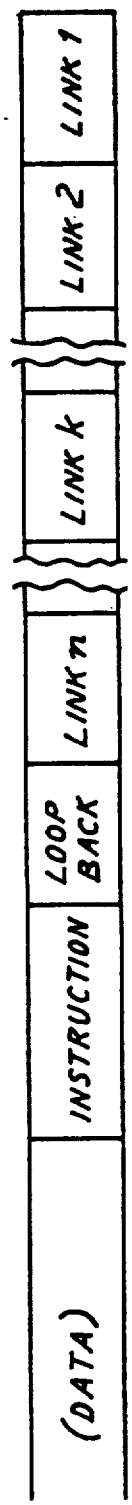
Figure 15:
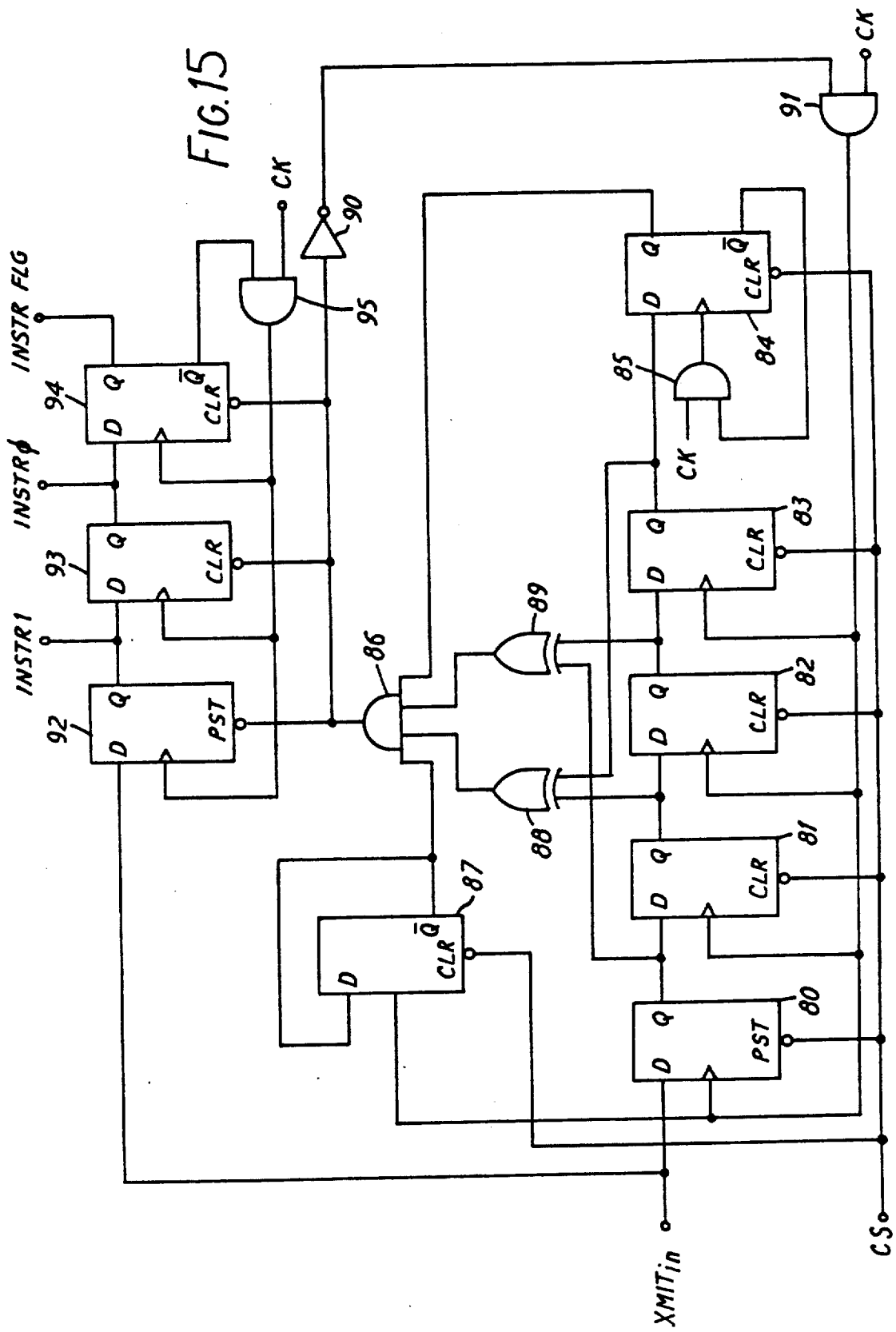

FIG. 6 is a diagram showing an array of chips on a wafer scale integrated circuit, FIG. 7 is a similar diagram showing paths to addressed chips, FIGS. 8 and 9 are block diagrams of alternative control unit for the chips, FIG. 8A is a more detailed diagram of part of FIG. 8, FIG. 10 shows three chips connected as part of a chain in a second embodiment, FIGS. 11A and 11B show address code formats for the second embodiment, FIG. 12 ia a circuit diagram of the configuration logic of one chip, FIG. 13 shows a plurality of super modules, each including a plurality of chips as in the second embodiment, FIG. 14 shows the format of a broadcast instruction, and FIG. 15 is a diagram of additional logic for handling broadcast instructions.

The invention provides a means of addressing and accessing random chips with minimum delay in a WSI application. It provides benefits for the random access of data storage chips from outside the wafer. In the first embodiment, all chip addressing is achieved through the data highway. No timing or synchronisation information need be distributed globally. Thus high speed communications are possible because no global timing constraints apply.

Figure 1:
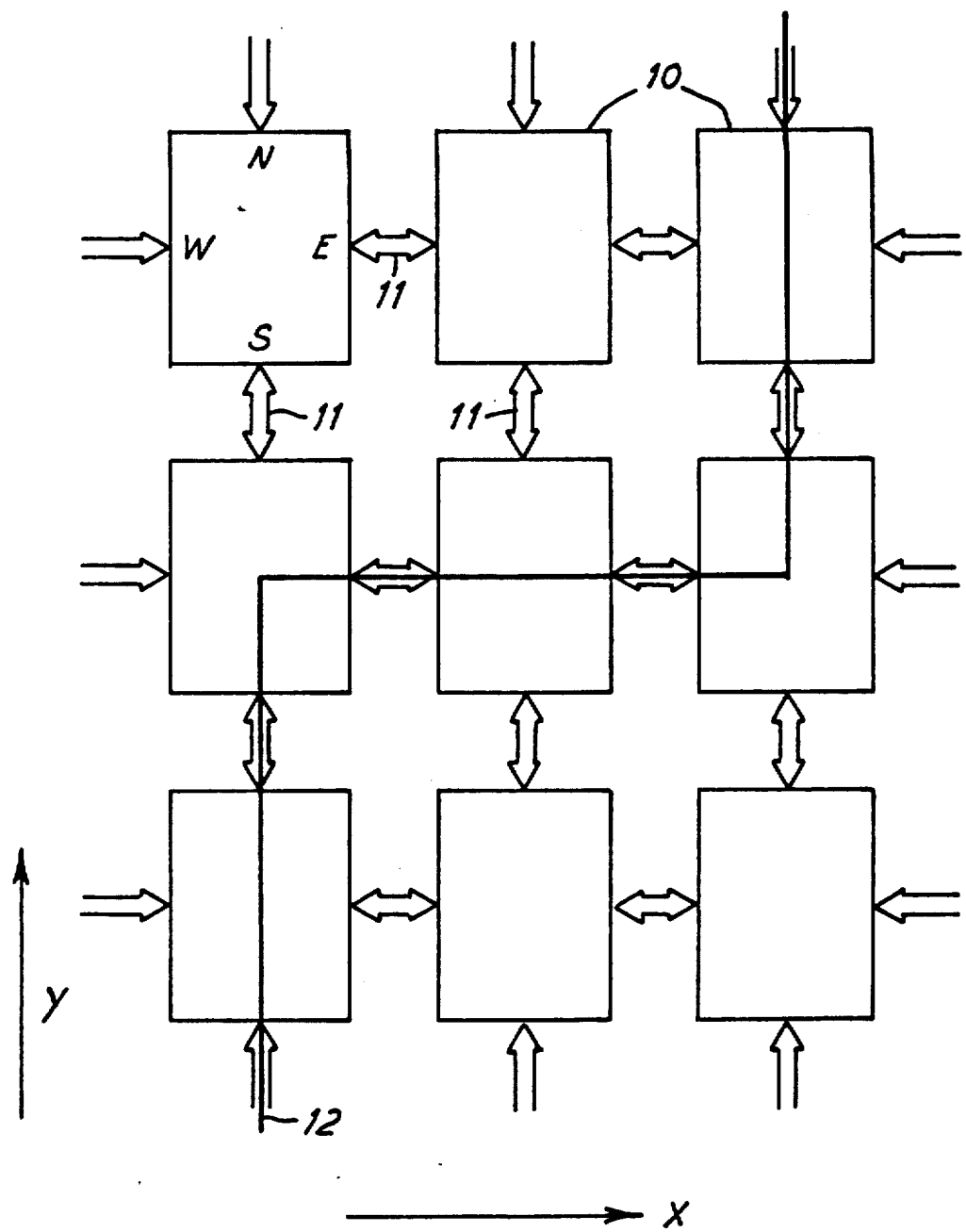
FIG. 1 is a diagram of part of an array of chips (modules)

FIG. 1 shows part of a WSI array of modules 10. The array in this example is rectangular and each module or chip 10 can be regarded as having four sides N, S, E, W (North, South, East, West) and corresponding nearest neighbour modules. Nearest neighbour modules are connected by sets of lines 11 which make it possible to establish a chain of linked chips, e.g., the chain denoted by a heavy line 12. As will be explained below, the chains leading to all possible target chips from a common start chip form an irregular tree structure, with no crossing paths. Only one path at a time can be set up from the start chip. Each chip includes both a function unit, e.g. a dynamic RAM and configuration logic which enables the chains to be set up.

Figure 2:
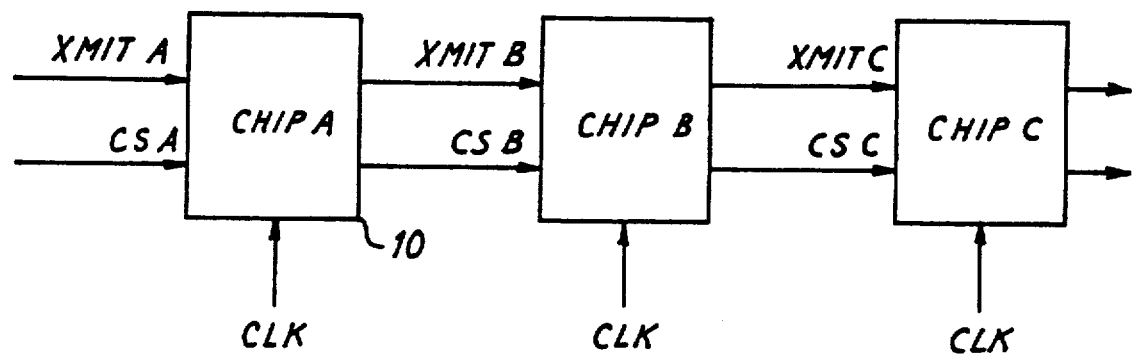
FIG. 2 shows three chips connected as part of a chain.

The chips may be identified in the array by their X and Y coordinate numbers. Once a chain is set up, its chips can be regarded as a series of chips A, B, C etc. as shown in FIG. 2. The main chip-to-chip connections are those shown, namely a forward or transmit serial data line XMIT and a chip-select line CS. Not shown in FIG. 2 is a return or receive data line REC which is provided in the preferred embodiment. Each chip receives a clock signal CLK which may be distributed globally to all chips on the wafer or be relayed only down the chain of chips, like CS. Unlike the data paths, all clock paths stay set up and exist simultaneously once configured. The number of nodes in a clock path chain is relatively small, minimising any distortion to the clock signal.

Each chip (X, Y) is assigned a unique address string which defines the minimum length path for access through a chain of chips with nearest-neighbour, interchip communication. The address is a coded series of directional instructions which define the successive links which must be formed between all intermediate chips to configure the path to the target-addressed chip.

Configuration of available chips on the wafer is efficient. A path can be mapped to all chips not trapped by chips whose configuration logic is defective.

A new path is configured by transmission of a single address string at the entry chip A on the wafer. Each chip in the path in turn strips off the first two bits at the head of the address string it receives to determine the direction of the next chip in the chain, and then treats all following bits as data to be passed on to the next selected chip.

Figure 3:
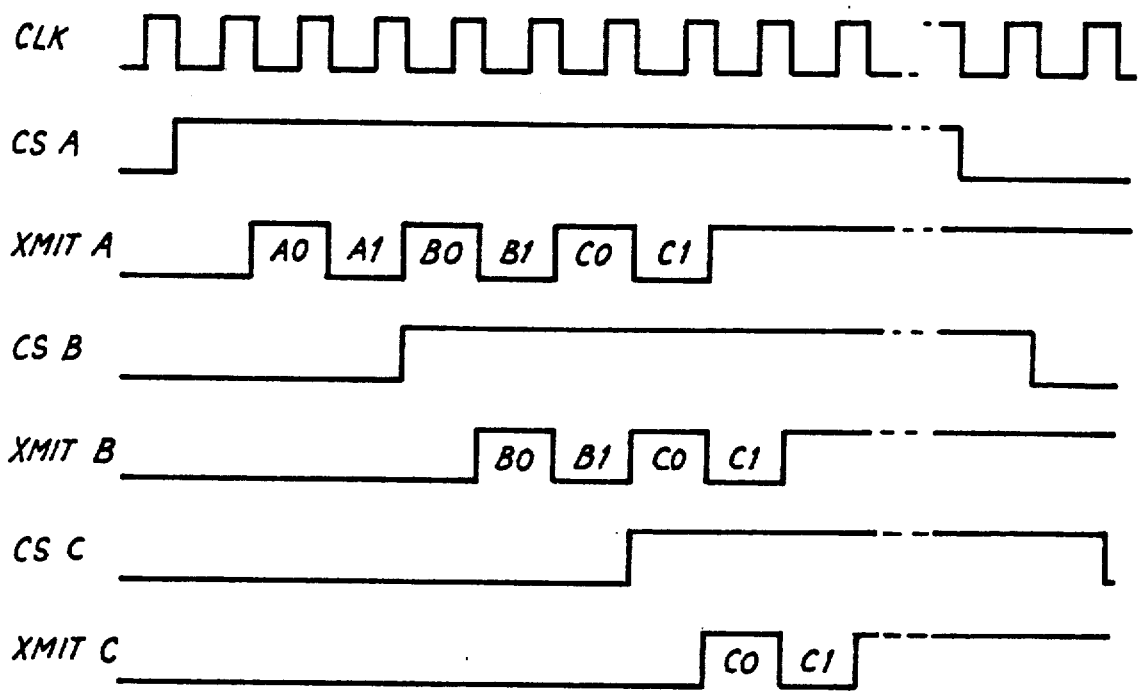
FIG. 3 shows timing waveforms.

This is illustrated in FIG. 3 showing the clock signal CLK, CS as asserted at chip A, the address string XMITA applied to chip A and so on. XMITA comprises di-bits A0, A1; B0, B1; C0, C1 whereas XMITB comprises only B0, B1 and C0, C1, while XMITC comprises C0, C1 only. The waveforms XMITA etc. in FIG. 3 identify the relevant bit periods, not the actual di-bit values.

The target-addressed chip is identified by setting its exit direction to coincide with its entry direction. This loop-back condition signals to a chip that it has been addressed to receive or transmit data.

A configured path is maintained by the presence of the static chip-select signal CS which passes along the chain of chips forming the path (FIGS. 2 and 3). A path is de-configured by de-asserting CS at the entry chip, and allowing the change to ripple along the configured chain of chips. CS need only be de-asserted for a single clock cycle to initiate de-configuration of an existing path, before it is re-asserted to configure a path to a new target-addressed chip.

The short chip access time permits a handshake to be incorporated into data transmission, allowing a communication path to be verified before data is passed. This gives greater security of data communication due to closed loop operation.

Because the required communication path is set up for each chip access, the wafer is not susceptible to interruption of a path by noise in a quiescent period, and any interruption of a path during a chip access has no repercussions on chips other than the one being accessed.

All intelligence for chip access control or dynamic RAM chip refresh is centralised off the wafer. The short chip access time permits control of dynamic RAM chip refresh from simple hardware off the wafer with little interruption to normal chip access.

An instruction can be broadcast to all chips along a path by having each chip recognise the address termination loop-back condition as it is passed to the next chip in the chain, then consider the following preset number of bits as an instruction. This provides an effective means of broadcasting instructions such as refresh.

Multiple entry points to a wafer may be provided, and separate paths configured to provide simultaneous access to several chips. It must be ensured that multiple paths never cross.

The absence of any global signalling allows one path to be de-configured and then re-configured whilst separate existing paths from other entry chips remain unaffected, with their communication links maintained.

The ability to separately reconfigure the multiple paths on a wafer allows data to be communicated with multiple bit widths, with external buffers maintaining synchronisation between data bits. This synchronisation is made necessary by the use of imperfect memory arrays, with the result that boundaries between blocks and chips will occur at different times for different bits of the data word. The short latency in accessing any chip on the wafer minimises the length of buffer which must be used to maintain this synchronisation.

The address string which is transmitted is in the form of coded directional information defining a direct path to the chip to be accessed. It comprises a series of two-bit packets of data, each of which defines one of four possible directions to be taken in forming the link between two successive chips in the chain. Each chip in the chain strips off the first two bits from the string it receives and uses them to determine which of its four neighbours should become the next chip in the chain. It then considers all subsequent bits of the string as data to be passed to the next chip thus set up. The principle may be extended to chips with more than four logical neighbours and data packets with more than two bits.

FIG. 3 shows that a selected chip in the chain is alerted by the assertion of its Chip Select (CS) line, which subsequently remains asserted for as long as the configured path is to be maintained. Following a one cycle delay, two bits of data are received on the Transmit (XMIT) input which indicate the required output direction to the next chip in the chain. A CS output signal is immediately generated and passed to the next chip thus identified, followed by the remainder of the address string after a single cycle delay.

The total delay in configuring a new path is three clock cycles for each link in the chain which must be formed.

A configured path is deleted by de-assertion of the CS signal to the first chip in the chain. This change ripples along the chain with one cycle delay per chip, breaking all configured links.

A chip is identified as the addressed chip to be accessed by the device of defining the output direction from the chip to be the same as its input direction. This is achieved by setting the final direction code in the address string to be the exclusive-OR function of the penultimate code, indicating a loop-back condition. This is interpreted by the final chip in the chain as a selection for access.

Figure 4:
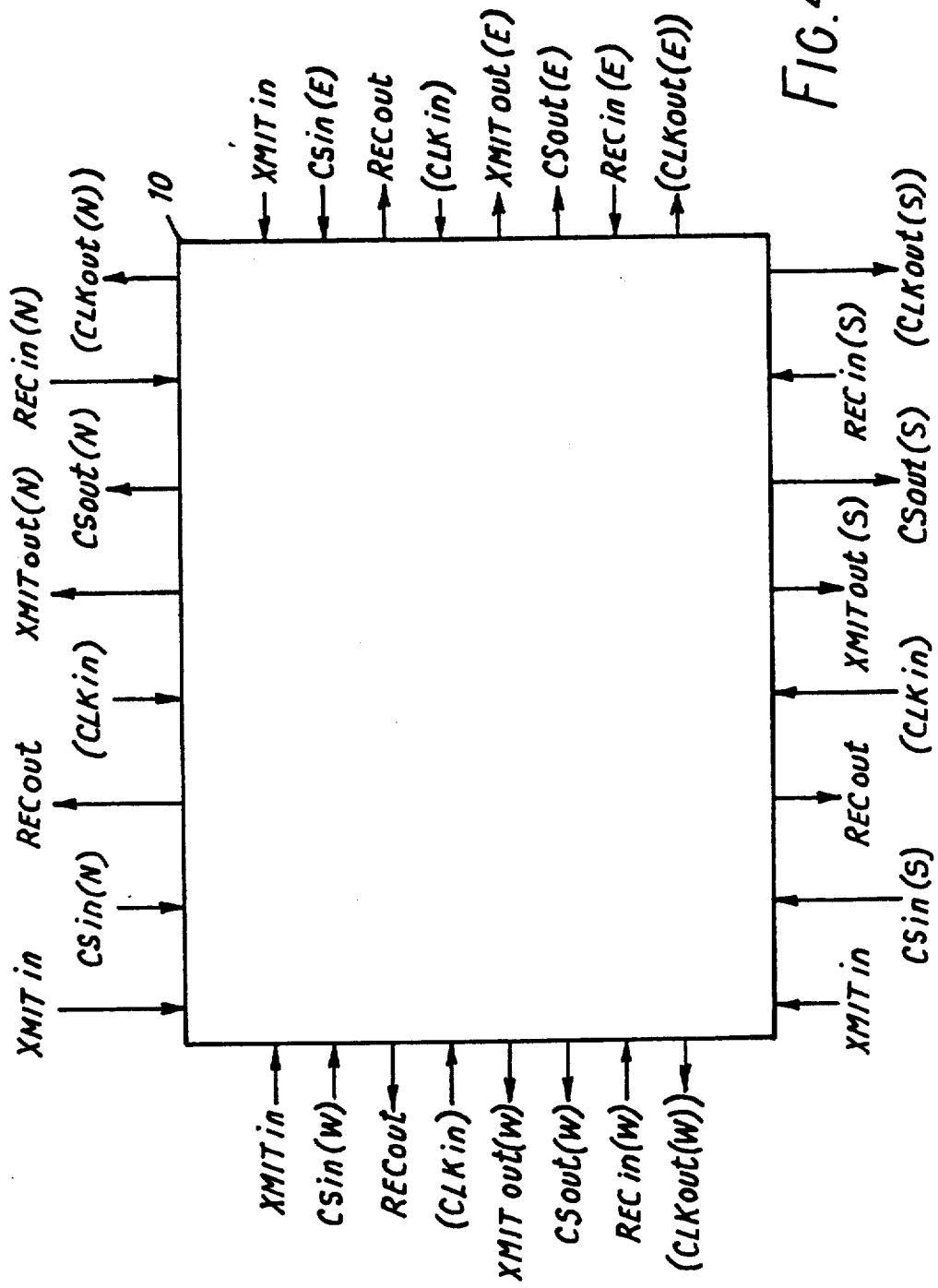
FIG. 4 shows the interconnecting signals of a single chip.

FIG. 4 shows the chip interconnection signals of a module 10. Each side of the chip has a connection XMITin; these four connections are commonly connected within the chip. The corresponding outputs XMITout(N) etc. are individual to the sides of the chip. Input connections RECin(N) etc. are individual to the sides of the chip whereas RECout is common. CSin(N) etc. and CSout(N) etc. are both individual to the sides. CLKinis common and CLKout(N) etc. are individual to the sides.

Figure 5:
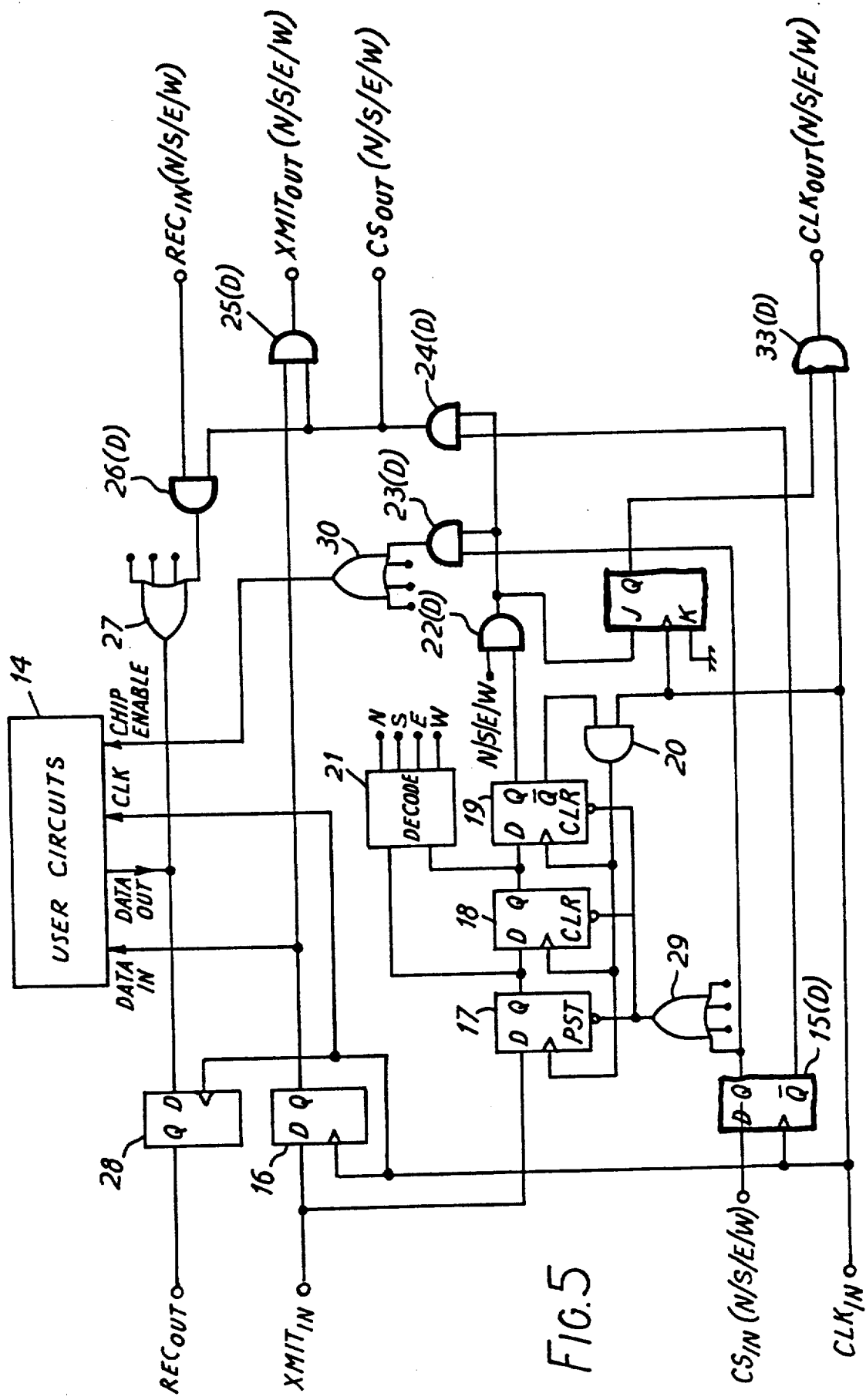
FIG. 5 is a circuit diagram of the configuration logic of one chip.

FIG. 5 shows the configuration logic together with the user circuits 14 whose precise nature forms no part of the present invention. It will be seen that these circuits have serial data in and data out terminals, a chip-enable terminal and a clock terminal. There are many known circuits with such connections. The user circuits could be dynamic RAM circuits substantially as described in W087/00675 for example.

Turning to the configuration logic itself, various D-type flip-flops and gates are shown, some in heavy lines. These are individual to the chip sides, i.e. the set of devices shown in heavy lines in replicated four times to provide a set for each side N, S, E and W. References for these lines conclude with the characters (D) where 'D' stands for direction and may be N, S, E or W. The devices shown in ordinary lines are common to all sides. Connections will not be described; they are clear from the drawing.

When a chip is accessed from a given side, CS true is latched in a corresponding flip-flop 15(D) and data on XMITin is buffered in a flip-flop 16 and also passed to three cascaded flip-flops 17, 18 and 19 which have been respectively preset, cleared and cleared, via an OR gate 29, so long as flip-flop 15(D) remains clear. After two clock cycles flip-flops 17 and 18 contain the first two bits of the address string arriving on XMITin and the flip-flop 19 contains the '1' bit preset in flip-flop 17. This state of the flip-flops is frozen because an AND gate 20 is then disabled by flip-flop 19 to remove the clock signal from the three flip-flops.

A decoder 21 decodes the di-bit in flip-flops 17 and 18 to a direction signal N, S, E, or W denoting the exit direction from the chip. The decode is to some extent arbitrary but the di-bits for N and S are complementary and the di-bits for E and W are also complementary. The decode could be, for arguments sake, 00=N, 11=S, 10=E and 01=W. An AND gate 22(D) corresponding to the decode is enabled by the set flip-flop 19 and provides an enabling signal to two AND gates 23(D) and 24(D). Which of these gates provides a true output depends upon the state of the CS flip-flop 15(D). The two situations are as follows:

(1) The chip is link-addressed. The gate 22(D) whose output is true will correspond to a different direction from the flip-flop 15(D) which is set. The gate 24(D) corresponding to the true gate 22(D) provides a true output and enables a corresponding gate 25(D) to pass XMITin, as buffered by flip-flop 16 to XMITout(N), (S), (E) or (W), in correspondence with the exit direction selected by the decoder 21. Because there are two additional clock delays in the cascaded flip-flops 17, 18, 19 relative to the delay through the buffer flip-flop 16, the address string which is passed on has been stripped of its two leading bits. The true gate 24(D) also enables a corresponding AND gate 26(D) to pass RECin(N), (S), (E) or (W) to RECout via an OR gate 27 and buffer flip-flop 28.

(2) The chip is target addressed. The gate 22(D) whose output is true will correspond to the same direction as the flip-flop 15(D) which is set. The gate 23(D) corresponding to the true gate 22(D) provides a true output and provides CHIP ENABLE to the user circuits 14 via an OR gate 30. These circuits have DATA IN connected to the output of the buffer flip-flop 16 and DATA OUT connected to the input of the buffer flip-flop 28 for the reception of commands and data via XMITin and the output of data via RECout.

The gated N, S, E or W signal from the gate 22(D) sets a corresponding flip-flop 34(D) which enables an AND gate 33(D) to pass CLKin to CLKout(N), (S), (E) or (W) in correspondence with the selected exit direction. The set flip-flop 34(D) remains set until the wafer is switched off.

FIG. 6 shows a hypothetical wafer with random defective chips resulting in a yield of 75%. Only the simple logic shown in FIG. 5 need function to allow a chip to be incorporated in a chain, and so this yield is very conservative for a practical case. The hypothetical wafer contains a total of 316 dice, which is representative of a practical case.

A simple wavefront mapping algorithm is employed to plot and record a direct path to all accessible chips on the wafer. The paths to all accessible and unmapped chips adjacent to the start chip are determined by trying to create all possible links from this chip. The paths thus formed have only one link, and the mapped chips are labelled 1 in FIG. 6. The process is repeated by attempting to access all unmapped chips adjacent to the chips labelled 1, to form all two-link paths to the chips labelled 2. As this process is repeated, paths to chips ahead of the advancing wave front of mapped chips are determined by the simple addition of a new link direction to the address strings already stored. FIG. 6 shows the positions of chips on the wavefront after 1 to 5 and 11 iterations of this process.

The routes of paths to all accessible chips on a wafer form an irregular tree structure whose root is the entry chips to the wafer.

From FIG. 6, the mapped path to chip (10, 4) requires three links to be made to the North, so that the address string required to access this chip is NNNS. The address string is thus 00000011 if the di-bits are assigned as indicated above. Similarly the path to chip (12.3) has a required address string NEENS.

FIG. 7 shows the routes of paths to chips (2.6), (2.15), (8.20), (13.20), (19.15) and (19.6), by way of example. Note that only one of these paths can be configured at any time.

With high chip yield, the wafer of FIG. 6 has a maximum path length of 24 links, and a median path length of 14 links. With 75% chip yield as shown, the wafer has a maximum path length of 28, still with a median of 14.

With 3 clock cycles required to form each link in the configuration of a path, the median access time of a chip on the wafer is 42 clock cycles, or 2.1 microseconds if a 20 megahertz clock frequency is assumed. Thus the time required to configure a path and transmit an instruction to every chip on the wafer is 664 microseconds. This would be the overhead required to initiate a refresh on dynamic RAM chips, for example.

Alternatively, an instruction can be transmitted to every chip on the wafer by configuring paths only to the chips on the periphery, and using the broadcast facility to the intermediate chips along the paths. Since there are only 56 peripheral chips, an instruction can be transmitted to every chip in 118 microseconds. The path configured for instruction broadcast need not be a direct path to a target chip, but could be arranged to be a meandering path to include a larger number of chips, for example, a spiral path. An embodiment of the invention with the broadcast facility is described below.

FIG. 8 shows a block diagram of the logic required to generate and control the chip address string and to interface the wafer to an electronic system.

The address string required to access each chip is stored in successive bytes in a ROM 35 the number of bytes required being dependent on the length of the path to the chip and hence the length of the address string. Each chip on the wafer is allocated one of a sequential series of identification numbers, and this chip number is used to define the most significant group of bits of the ROM address input. The least significant address bits are controlled from a byte counter 36, which is incremented to address the successive bytes of the address string. Successive bytes of the address string are loaded into a shift register 37 and shifted to the wafer XMIT input, until a loop-back condition of direction codes is detected by a detector 39. This indicates the end of the address string and causes data to be switched to XMIT line via a multiplexer 38.

FIG. 8A shows the shift register 37 and the loop back detector 39. The shift register comprises eight stages which are parallel-loaded from the ROM 35, including a stage 40 towards the least-significant end, which is the stage from which the address string passes out to the multiplexer 38. The register further comprises another three less significant stages 41. Two exclusive OR gates 42 and an AND gate 43 detect when the di-bit with its less-significant bit in stage 40 is complementary to the di-bit in the two least-significant of the stages 41. The gate 43 provides a signal to a sequencer 44 and is enabled only in even clock periods by a divide by two counter stage 49.

The sequencer provides overall control of the system and in particular responds to a signal 45 from the computer commanding the system as a peripheral to initiate addressing a target chip, signals back to the computer on line 46 when the address string has been sent out, asserts CS at the entry chip until commanded by the computer to clear down the chip chain, and responds to the loop back detection signal to switch over the multiplexer 38 to transmit data from the computer. It also clears and increments to the byte counter 36.

Refresh of dynamic RAM chips on the wafer may be controlled by multiplexing to the ROM address input a chip number from a chip refresh counter 47, in order to initiate refresh cycles in the chips in preset order in a regular cycle. Refresh may be initiated in bursts or all chips may be triggered in one operation.

The sequencer 44 controls both the refresh counter 47 and a multiplexer 48 which selects between the chip number provided by the counter and the chip number to a target chip input by the computer. The sequencer also increments the byte counter 36 after every eight bits shifted out of the register 37, so long as the loop-back detection signal has not been provided.

FIG. 9 shows the logic diagram of an alternative method of storing and generating the chip address string. The ROM 50 stores for each chip only the two bit direction code defining the link to the preceding chip in the chain. The chip number is not one of a sequential series but is formed by separate numbers indicating X and Y coordinates on the chip grid on the wafer. Target chip X and Y coordinates from the computer are loaded into up/down counters 51 and 62 which address the ROM, and the two bit code read from ROM is loaded into a shift register 53 to be interpreted to control increment or decrement of the counters to point to the preceding chip in the chain. This process is repeated until the counters point to the start chip, i.e. both counters signal zero contents back to the sequencer. Another shift register 54 is used to buffer the address string being constructed. The address string is finally shifted out to the XMIT line, to be followed by data. This method uses less ROM storage than the first described above, but takes longer to address a chip on the wafer because of the buffering required to reverse the order of the address string.

Direction interpretation is effected by a circuit 55 which decodes the link directions and then enables only one counter to be counted up or down by one. For example, if the link direction is N, the preceding chip is to the South of the current chip. The counter 51 must stay unchanged but the Y counter 52 must be decremented. The sequencer 44 provides the various timing (clock) signals CK provided to the shift registers 53, 54 and counters 51, 52.

The techniques described previously can be extended to include an asynchronous communications scheme to allow immediate random access of chips within a wafer scale device.

The technique is based on the same technique of accessing a chip by a coded address defining the most direct path to that chip, but the address is presented in parallel rather than serial. Access to the chip is therefore within a single operating cycle since there is no pipelining of address and data.

The elimination of pipelining means that the cumulative delay from signal routing at each chip node limits chip access time, and operating speed reduces with increasing number of chips on the wafer. For this reason, the technique may be most appropriate to high speed systems in the form of "sub-wafer-scale integration", which is defined as a multi-chip module of a size less than that of a complete wafer, with a wafer comprising several such modules which can be individually diced.

This technique is particularly applicable to random access memory modules which act as high capacity memory "superchips" formed from memory chips of lower capacity. The access time can be minimised if a high-speed semiconductor technology can be utilised for the communications paths. This can be achieved through the use of Bipolar or BiCMOS memory technologies.

The principle of linking chips to form a communication path to the chip being addressed is illustrated in FIG. 10. An address string in the form of coded directional information defining a direct path to the chip being accessed is presented in parallel to the first chip. Each input in FIG. 10 represents a di-bit code defining the direction (N, S, E or W) of a link in the communications chain. The most significant two bits are used by a direction decoder 60 to determine the direction of the second chip, and the address string is passed on after a di-bit shift, by direction select logic 61. The two least significant bits passed on are set to logical zero. This process continues at each successive chip in the chain.

FIGS. 11A and 11B illustrate the form of the address string. If the maximum path length is L, the maximum string length is N=2 L+1, namely L di-bits plus an extra marker bit. FIG. 11A assumes a path length of M, less than L and the initial string consists of di-bit links 1 to M in the 2M most significant bit positions, with the extra marker bit=1 in the next position. FIG. 11B shows the string when it has reached the target chip. The marker bit is now in the most significant position; all other bits are zero. This tells the chip that it is target-addressed, rather than link-addressed.

A more detailed implementation of the control mechanisms for this process is shown in FIG. 12.

FIG. 12 shows the configuration logic specifically for the E side of the chip. Elements specific to this direction are shown in heavy lines. The chip interconnection signals for the E side are as follows:

IN

CSin (common to all sides)
Ain,N-1 to Ain,0 for the N bits of the address string (common to all sides)
XMITin (common to all sides)
RECin(E)

OUT

CSout(E)
Aout,N-1(E) to Aout,0(E)
XMITout(E)
RECout (common to all sides)

The lines Ain,N-1 to Ain,0 are all connected to a chip select decoder 63 which detects the target addressed string of FIG. 11B and then provides CHIP ENABLE to the user circuit 14.

The direction decoder 60 decodes Ain,N-1 and Ain,N-2 to provide an exit direction selection signal N, S, E, or W but only when it is (a) enabled by the presence of CS from a preceding chip and (b) not disabled by CHIP ENABLE from the decoder 63.

If the direction signal E is provided, it enables the following AND gates:

Gate 64 which passes CSin as a CSout(E).

Gates 65 (N-2 gates) which pass Ain,N-3 to Ain,0 as Aout,N-1(E) to Aout,2(E) respectively.

Gates 66 which pass logic '0' as Aout,1(E) and Aout,0(E).

Gate 67 which passes XMITin as XMITout(E).

Gate 68 which passes RECin(E) as RECout.

A memory system formed from a plurality of multi-chip arrays 70 is shown in FIG. 13. The arrays share common address, data and control inputs, with individual Chip Select lines 71 to select a unique array. The address string defining the access route within an array is designated as the Chip Address Link Code and is contained in the Chip Address Translation ROM 72. This string will differ from array to array and the ROM 72 is therefore addressed both by the chip address and the array address. The latter is decoded by a decoder 73 to provide CS to the selected array. The Chip Address Link Code is passed by an N-bit bus 74 to Ain,N-1 to Ain,0 of the entry chip of all arrays 70.

A data and control bus 75 includes the XMIT and REC lines, power supply lines and such other global signal as are required, e.g. RAS, CAS and WE if the user circuits 14 are DRAM's.

Finally a bit address bus 76 conveys a K-bit bit address to every chip for addressing the bit to be written to on XMIT or read from on REC.

Although the data path in FIGS. 10 to 13 is a serial path separate from the parallel path for addressing the chips, it would be possible to use the parallel path for data transfer also, by analogy with FIG. 5 which uses the same serial path for addressing and data.

FIG. 14 shows the format of a broadcast instruction, for the serial embodiment of FIG. 5. This commences with LINK1 ... LINKk ... LINKn ..., where each LINK is a di-bit code for linking on to the next chip. LINKn links to the target-addressed chip and is therefore followed by the LOOP BACK di-bit which commands the target-addressed chip to use an exit direction back to the chip from which the target-addressed chip was entered. LOOP BACK is *immediately* followed by a plurality of INSTRUCTION bits and optionally by DATA for a write instruction. The number of INSTRUCTION bits is fixed and may be just two bits in a simple embodiment.

Chip k in the chain will receive a data stream commencing with the LINKk code, as described previously. All chips in the chain can identify the instruction code by searching for the loop-back condition in the XMITin data stream, and then interpreting the following preset number of bits as an instruction. The instruction field can define both broadcast instructions to be executed by all chips in the chain, and target instructions to be executed only by the target addressed chip.

FIG. 15 shows the logic which implements the broadcast facility. This logic is additional to that shown in FIG. 5. The loop-back code is detected by a chain of five flip-flops 80 to 84 of which the first is preset so long as CS is false and the remainder are cleared. As soon as CS (at the output of the OR gate 29 in FIG. 5) goes true, the incoming bit-stream on XMITin is clocked into the chain of flip-flops. Once the preset bit which starts in the flip-flop 80 reaches the flip-flop 84, the first two di-bits are in the flip-flops 80 to 83 and it is appropriate to start looking for the loop back code. Up until that time, it could have been detected spuriously because of the initial states of the flip-flops 80 to 83. Once the preset bit sets the flip-flop 84, the bit is frozen therein by disabling a gate 85 through which the flip-flop is clocked. Moreover, the flip-flop 84 provides a first of four required enabling inputs to an AND gate 86 which is the loop-back detection gate.

The second enabling input is provided by a flip-flop 87 connected to divide CK by two and provide its enabling input to the gate 86 only in those clock cycles in which there is one di-bit in flip-flops 80 and 81 and another di-bit in flip-flops 82 and 83, (not in those cycles in which a di-bit is in flip-flops 81 and 82). The remaining enabling inputs are provided by two EXCLUSIVE OR gates 88 and 89 which detect when the di-bit in flip-flops 80 and 81 is the exclusive or of that in the flip-flops 82 and 83, i.e., the di-bit in 80, 81 is the LOOP BACK code of LINKn in 82, 83.

Once the output of the AND gate 86 goes true, the clock signal CK is removed from the flip-flops 80 to 83 and 87 by an inverter 90 and an AND gate 91. The output of the gate 86 thus freezes true. So long as this output had remained false another chain of three flip-flops 92, 93, 94 was held preset, clear, clear, thus putting a marker bit in the first flip-flop 92. The ensuing instruction bits are now clocked into the flip-flops 92 and 93 and the marker bit is clocked into the flip-flop 94, whereupon the clock signal CK is removed from all three flip-flops by a gate 95.

The three flip-flops now respectively provide instruction bit 1, instruction bit 0 and instruction flag. These three bits are furnished to the user circuits 14 (FIG. 5) which decode the two instruction bits when the instruction flag is true.

The four possibilities with just two instruction bits may be decoded as NOP (00), refresh, read and write and the user circuits 14 (dynamic RAM) may be configured so that they always obey refresh (i.e., whether target-addressed or link-addressed) but obey read and write only in the presence of CHIP ENABLE from the gate 30 in FIG. 5, i.e., when target-addressed. Only refresh is then a broadcast instruction.

The logic of FIG. 15 can readily be extended to handle longer instruction fields by adding the appropriate number of flip-flops in the chain between flip-flop 93 and flip-flop 94.

What is claimed is:

1. A random address system for an array of circuit modules, comprising a plurality of circuit modules arranged in a two-dimensional array and a control circuit, each module within the array having a plurality of neighboring modules of the array disposed in different directions relative to said module and wherein each module includes function circuits and configuration logic responsive to a plural bit link command to link that module on to a neighboring module in a direction relative to the first said module selected by the link command, different combinations of the plural bits of said link command corresponding to respective different ones of said relative directions, wherein the control circuit is adapted to address as a target module any module of the array by forming and sending to an entry module a unique set of link commands corresponding to the target modules to be addressed, such that a plurality of the modules may be connected in a chain leading from the entry module to any module of the array selected as the target module, by means of the set of link commands, and wherein the configuration logic of each module is responsive to a first link command of a set of link commands arriving thereat to link that module to a next module selected by that first link command and to send on to the said next module the set of link commands stripped of the plurality of bits constituting said first link command, and wherein the modules connected in a chain comprise the target module and all the preceding modules in the chain, which preceding modules function as link modules establishing a communication path for transfer of commands and data to and from the function circuits in the target module, the function circuits being operative to perform at least one of a data storing and a data processing function.

2. A system according to claim 1, characterised in that the link commands form a serial stream and the said first link command is stripped by preventing the bits thereof passing on to the said next module, while permitting all subsequent bits to pass on to the said next module.

3. A system according to claim 2, characterised in that the set of link commands terminates with a terminating command indicating to the module responding thereto that it is addressed as the target module, not as a link module preceding the target module in the chain of modules.

4. A system according to claim 3, characterised in that the terminating command commands the target module to link back to the preceding link module and in that each module comprises logic responsive to a comparison between the direction into which it was linked by the preceding module and the direction in which it is commanded to link to the next module to detect the terminating command and switch the module to a target-addressed state in which the function circuits of the module are responsive to function commands and data sent along the chain of linked modules.

5. A system according to claim 4, characterised in that the modules are linked by a single bit-serial data path which serves to carry the link commands and the function commands and data, the function commands and data being routed to the said function circuits of the module in the target-addressed state.

6. A system according to claim 3, characterised in that each module includes a circuit for detecting the terminating command and for responding to an immediately succeeding function command, regardless of whether the module is addressed as the target module or as a link module.

7. A system according to claim 6, characterised in that the function circuits of each module includes a dynamic RAM and refresh circuitry responsive to a refresh command sent thereto as a said immediately succeeding function command, said RAM being accessed for read and write operations via said chain of modules.

8. A system according to claim 1, characterised in that the link commands are transmitted in parallel from module to module and each module comprises means for so shifting the link commands as to shift out the said first link command before the set of link commands is sent on to the next module.

9. A system according to claim 8, characterised in that the parallel commands include a marker pattern and each module is adapted to detect when the set of commands sent thereto consists solely of the marker pattern and then to switch the module to a target-addressed state in which the function circuits of the module are responsive to function commands and data sent along the chain of linked modules.

10. A system according to claim 1, characterised in that a clock signal is distributed globally to all modules of the array.

11. A system according to claim 1, characterised in that a clock signal is relayed down the chain of modules to all modules in the chain.

12. A system according to claim 1, characterised in that the unique sets of link commands correspond to a repeatedly branching tree of module chains, none of which chains cross each other.

13. A system according to claim 12, characterised in that the tree branches at every module from which it is possible to branch.

14. A system according to claim 12 or claim 13, characterised in that there is a plurality of entry modules whose trees of module chains serve unique sub-sets of the array of modules without any crossing of module chains.

15. An integrated circuit comprising an array of modules, including defective modules, wherein each one module within the array has a plurality of neighboring modules of the array disposed in different directions relative to said one module and each module includes configuration logic responsive to a plural bit link command to link that module on to a neighboring module in a direction relative to the first said module selected by the link command, whereby a plurality of the modules may be connected in a chain leading from an entry module to a target module, by means of a plurality of link commands, and a control circuit storing a plurality of sets of link commands corresponding to all possible target modules and adapted to address a target module in the array by sending to the entry module one of the set of link commands corresponding to the target module to be addressed, wherein the sets of link commands correspond to a repeatedly branching tree of module chains, none of which chains cross each other and the tree branches at every module from which it is possible to branch and wherein the control circuit is adapted to strip down an existing chain of modules leading to a target module when a new target module is to be addressed and sets up a new chain to the new target module using one of the sets of link commands stored in the control circuit.

16. A system according to claim 1 or 15, comprising means for applying a select signal to said entry module and wherein each module of said array is operative to link to a neighbouring module only in the presence of said select signal and comprises means for relaying said select signal to the next module in a said chain and wherein termination of the application of said select signal to said entry module results in termination of said select signal in all said modules to which said select signal is relayed, whereby the links of all these modules to neighbouring modules are broken.

17. A system according to claim 16, wherein said terminating command is constituted by an impermissible one of said link commands commanding said target module to link back in the direction of the preceding link module in said chain.

18. A system according to claim 16, wherein said terminating command is constituted by a distinctive marker pattern comprising at least one bit.

19. A system according to claim 16, characterised in that a clock signal is relayed down the chain of modules to all modules in the chain and each module includes latching circuitry whereby the clock-signal relay path remains established once a chain of modules has been formed, even when the links between the modules in the chain have been broken.

20. A random address system for an array of circuit modules, comprising a plurality of circuit modules arranged in a two-dimensional array such that each one module within the array has a plurality of neighbouring modules of the array disposed in different directions relative to said one module and wherein each module includes function circuits and logic means for decoding and implementing commands, said commands including a plurality of different link commands corresponding to respective ones of said relative directions and a terminating command, said logic means including configuration logic responsive to one of said link commands to link the module on to a neighbouring module in the direction corresponding to said one link command, means for applying to an entry module a sequence of link commands plus a terminating command, whereby a plurality of the modules are connected in a chain leading from said entry module to a module of the array selected as a target module, and wherein configuration logic of each module is responsive to a first link command of a set of link commands arriving thereat to link that module to a next module selected by that first link command and to send on to the said next module the set of link commands stripped of the said first link command, and wherein the modules connected in a chain comprise the target module and all the preceding modules in the chain, which preceding modules function as link modules establishing a communication path for transfer of commands and data to and from the function circuits in the target module, the function circuits being operative to perform at least one of a data storing and a data processing function, and wherein that module which receives said terminating command without a preceding link command constitutes said target module and is responsive to said terminating command to enable operation of the function circuits thereof.

21. A random address system for an array of circuit modules, comprising a plurality of circuit modules arranged in a two-dimensional array such that each one module within the array has a plurality of neighbouring modules of the array disposed in different directions relative to said one module and wherein each module includes function circuits and configuration logic responsive to a link command to link that module on to a neighbouring module in a direction relative to the first said module selected by the link command, control means for applying to a first of said modules a sequence of link commands to cause a plurality of said modules to be connected in a chain leading from said first module to a module of the array selected as a target module, and wherein the configuration logic of each module is responsive to a first link command of a set of link commands arriving thereat to link that module to a next module selected by that first link command and to send on to the said next module the set of link commands stripped of the said first link commands, and wherein said control means is further operative to apply a select signal to said first module and wherein each module of said array is operative to link to a neighbouring module only in the presence of said select signal and comprise means for relaying said select signal to the next module in a said chain and wherein termination of application of said select signal to said entry module results in termination of said select signal in all said modules to which said select signal is relayed, whereby the links of all these modules to neighbouring modules are broken.

22. A random address system for an array of circuit modules, comprising a plurality of circuit modules arranged in a two-dimensional array such that each one module within the array has a plurality of neighboring modules of the array disposed in different directions relative to said one module and wherein each module includes function circuits and configuration logic responsive to a plural bit link command to link that module on to a neighboring module in a direction relative to the first said module selected by the link command, different combinations of the plural bits of said link command corresponding to respective different ones of said relative directions, whereby a plurality of the modules may be connected in a chain leading from an entry module to any module of the array selected as a target module, by means of a plurality of link commands, and wherein the configuraiton logic of each module is responsive to a first link command of a set of link commands arriving thereat to link that module to a next module selected by that first link command and to send on to the said next module the set of link commands stripped of the plurality of bits constituting said first link command, wherein the modules connected in a chain comprise the target module and all the preceding modules in the chain, which preceding modules function as link modules establishing a communication path for transfer of commands and data to and from the function circuits in the target module, the function circuits being operative to perform at least one of a data storing and a data processing function and wherein the modules in the communication path are connected by a data path which serves to carry the link commands and data being routed to the function circuit of the said target module.

23. A random address system for an array of circuit modules, comprising a plurality of circuit modules arranged in a two-dimensional array such that each one module within the array has a plurality of neighboring modules of the array disposed in different directions relative to said one module and wherein each module includes function circuits and configuration logic responsive to a plural bit link command to link that module on to a neighboring module in a direction relative to the first said module selected by the link command, different combinations of the plural bits of said link command corresponding to respective different ones of said relative directions, whereby a plurality of the modules may be connected in a chain leading from an entry module to any module of the array selected as a target module, by means of a plurality of link commands, and wherein the configuration logic of each module is responsive to a first link command of a set of link commands arriving thereat to link that module to a next module selected by that first link command and to send on to the said next module the set of link commands, wherein the link commands are transmitted from module to module in parallel and each module includes means for shifting the link commands as to shift out the said first link command before the set of link commands is sent on to the next module, and wherein the modules connected in a chain comprise the target module and all the preceding modules in the chain, which preceding modules function as link modules establishing a communication path for transfer of commands and data to and from the function circuits in the target module, the function circuits being operative to perform at least one of a data storing and a data processing function.

* * * * *